United States Patent
Ge

(10) Patent No.: US 11,735,256 B2
(45) Date of Patent: Aug. 22, 2023

(54) REDUCING DISTURBANCE IN CROSSBAR ARRAY CIRCUITS

(71) Applicant: TETRAMEM INC., Newark, CA (US)

(72) Inventor: Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 344 days.

(21) Appl. No.: 16/558,119

(22) Filed: Sep. 1, 2019

(65) Prior Publication Data

US 2021/0065793 A1  Mar. 4, 2021

(51) Int. Cl.
*G11C 13/00* (2006.01)

(52) U.S. Cl.
CPC ...... *G11C 13/0033* (2013.01); *G11C 13/0069* (2013.01); *G11C 13/0097* (2013.01); *G11C 2013/009* (2013.01); *G11C 2213/74* (2013.01); *G11C 2213/79* (2013.01)

(58) Field of Classification Search
CPC ............ G11C 13/0033; G11C 13/0097; G11C 13/0069; G11C 2213/79; G11C 2213/74; G11C 2013/009
See application file for complete search history.

(56) References Cited

U.S. PATENT DOCUMENTS

| | | | | |
|---|---|---|---|---|
| 9,892,782 B1* | 2/2018 | Nagey | ................... | H03M 1/685 |
| 2005/0200379 A1* | 9/2005 | Lee | ...................... | G11C 7/1057 |
| | | | | 326/29 |
| 2006/0006915 A1* | 1/2006 | Yan | ...................... | H04N 5/3597 |
| | | | | 327/175 |
| 2009/0073752 A1* | 3/2009 | Fackenthal | ........ | G11C 13/0064 |
| | | | | 365/163 |
| 2009/0154232 A1* | 6/2009 | Norman | ............. | G11C 16/3427 |
| | | | | 365/185.02 |
| 2013/0163320 A1* | 6/2013 | Lam | ......................... | G11C 8/08 |
| | | | | 365/163 |
| 2013/0163322 A1* | 6/2013 | Lam | .................... | G11C 13/0069 |
| | | | | 365/163 |
| 2014/0153315 A1* | 6/2014 | Kwon | .............. | G11C 29/50008 |
| | | | | 365/148 |
| 2018/0253643 A1* | 9/2018 | Buchanan | ........... | H03M 1/1245 |
| 2019/0355788 A1* | 11/2019 | Chang | ................. | G11C 11/2259 |
| 2020/0105833 A1* | 4/2020 | Kavalieros | ........... | H01L 29/517 |

FOREIGN PATENT DOCUMENTS

KR        20100106149 A   * 10/2010

OTHER PUBLICATIONS

KR20100106149A machine translation. (Year: 2020).*

* cited by examiner

*Primary Examiner* — Khamdan N. Alrobaie
(74) *Attorney, Agent, or Firm* — Jaffery Watson Mendonsa & Hamilton LLP

(57) ABSTRACT

Technologies relating to using a slew rate controller to reduce disturbance in a crossbar array circuit are disclosed. An example crossbar array circuit includes: one or more bit lines; one or more word lines; one or more 1T1R cells connected between the bit lines and the word lines; one or more ADCs connected to the one or more bit lines; one or more DACs connected to the one or more word lines; one or more access controls connected to the one or more 1T1R cells and configured to select a 1T1R cell in the one or more 1T1R cells and to program the selected 1T1R cell; and a slew rate controller connected to the DACs, wherein the slew rate controller is configured to receive an input signal. The slew rate controller may be configured to transform a step function input signal into a slew rate input signal.

12 Claims, 9 Drawing Sheets

6000
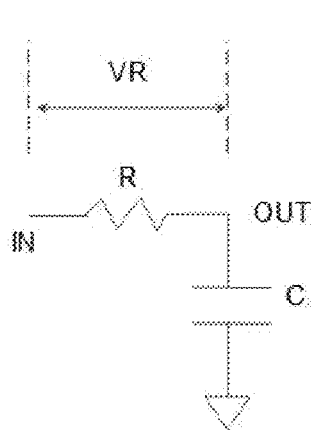
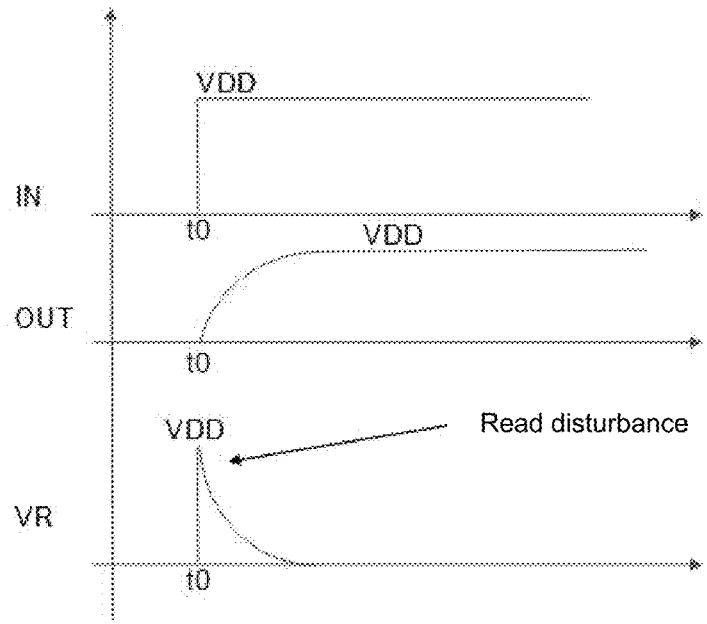
FIG. 6A
6100
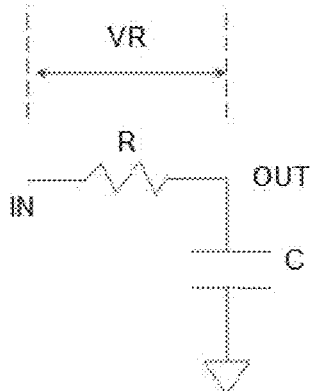
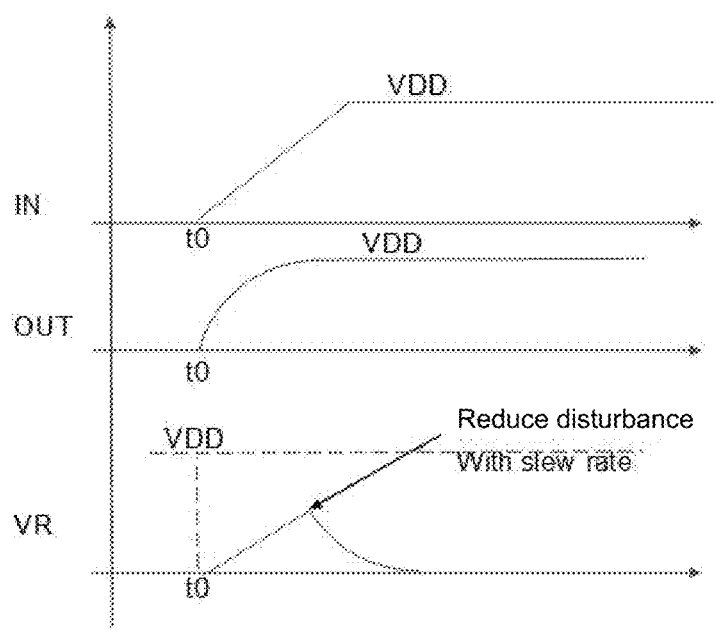
FIG. 6B

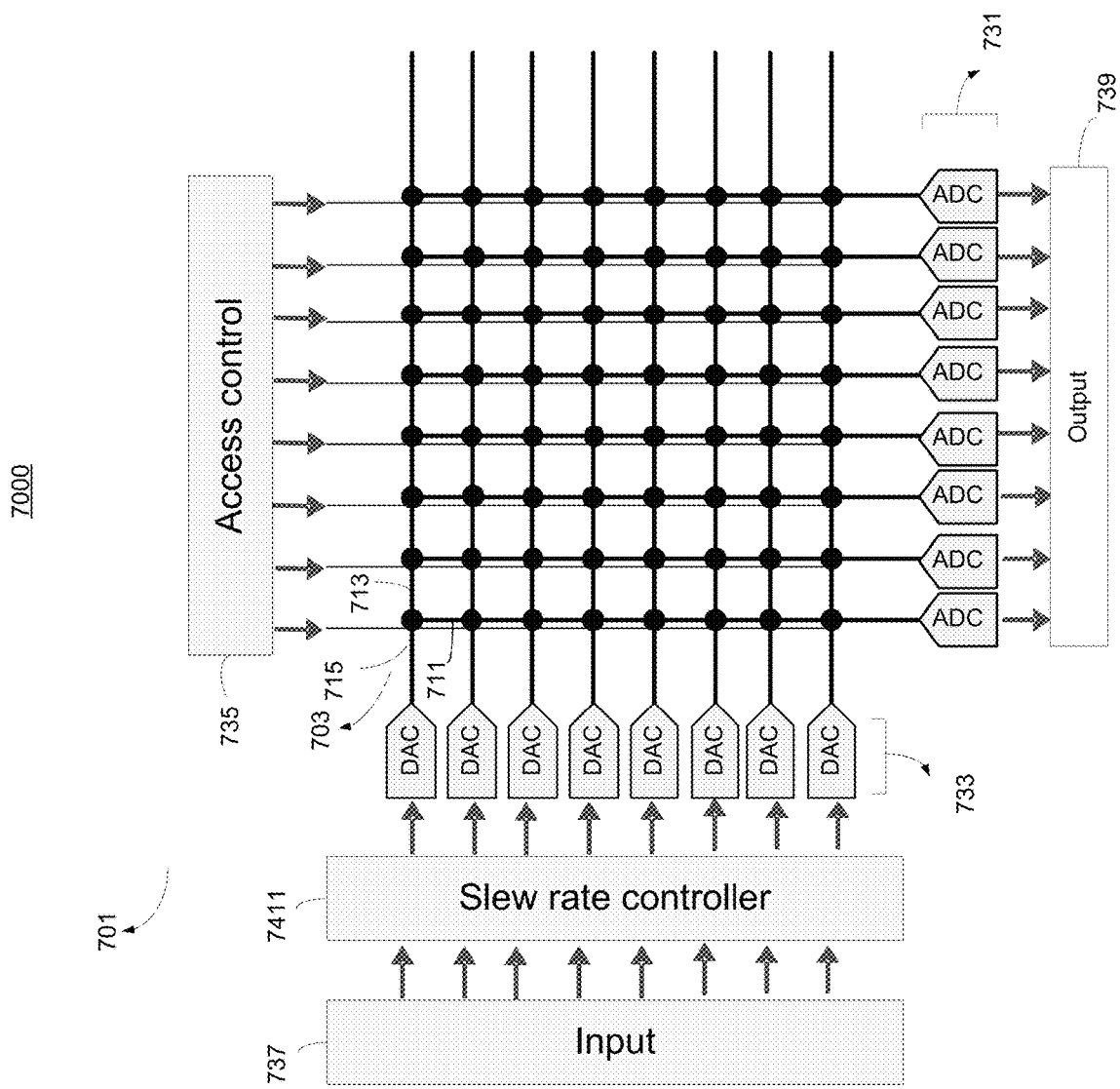

US 11,735,256 B2

REDUCING DISTURBANCE IN CROSSBAR ARRAY CIRCUITS

TECHNICAL FIELD

The present disclosure relates generally to crossbar array circuits equipped with one or more Resistive Random-Access Memory units (also referred to as RRAMs) and more specifically to crossbar array circuits using slew rate controllers to reduce disturbance for in-memory computing operations.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

An RRAM is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process.

A Digital-to-Analog Converter (DAC) is a device that converts a digital signal into an analog signal; an Analog to Digital Converter (ADC) is a device that converts an analog signal into a digital signal. ADCs and DACs are used as the interfaces between crossbars and digital circuits.

SUMMARY

Technologies relating to crossbar array circuits using slew rate controllers to reduce disturbance for in-memory computing operations are disclosed.

A crossbar array circuit, in some implementations, includes: one or more bit lines; one or more word lines; one or more one-transistor-one-memristor (1T1R) cells connected between the bit lines and the word lines; one or more ADCs connected to the one or more bit lines; one or more DACs connected to the one or more word lines; one or more access controls connected to the one or more 1T1R cells and configured to select a 1T1R cell in the one or more 1T1R cells and to program the selected 1T1R cell; and a slew rate controller connected to the DACs, wherein the slew rate controller is configured to receive an input signal.

A 1T1R cell in the one or more 1T1R cells, in some implementations, comprises a transistor and an RRAM device.

The slew rate controller is, in some implementations, configured to transform a step function input signal into a slew rate input signal.

A crossbar array circuit comprising: one or more bit lines; one or more word lines; one or more 1T1R cells connected between the bit lines and the word lines; one or more ADCs connected to the one or more bit lines; one or more DACs connected to the one or more word lines; one or more access control devices connected to the one or more 1T1R cells and configured to select a 1T1R cell in the one or more 1T1R cells and to program the selected 1T1R cell; and a slew rate controller connected to the one or more access controls, wherein the slew rate controller is configured to receive a signal from one of the one or more access control devices.

A 1T1R cell in the one or more 1T1R cells, in some implementations, comprises a transistor and an RRAM device.

The slew rate controller is, in some implementations, configured to transform a step function input signal into a slew rate input signal.

A crossbar array circuit comprising: one or more bit lines; one or more word lines; one or more 1T1R cells connected between the bit lines and the word lines; one or more ADCs connected to the one or more bit lines; one or more DACs connected to the one or more word lines; one or more access control devices connected to the one or more 1T1R cells and configured to select a 1T1R cell in the one or more 1T1R cells and to program the selected 1T1R cell; and a slew rate controller connected to the one or more bit lines, wherein the slew rate controller is configured to receive an input signal.

A 1T1R cell in the one or more 1T1R cells, in some implementations, comprises a transistor and an RRAM device.

The slew rate controller is, in some implementations, configured to transform a step function input signal into a slew rate input signal.

BRIEF DESCRIPTION OF THE DRAWINGS

FIG. 6A is a block diagram illustrating voltage across an RRAM device for a step function input.

FIG. 6B is a block diagram illustrating the voltage across an RRAM device for a slew rate control input.

FIG. 7 is a block diagram illustrating a crossbar array circuit with a slew rate controller connected between an input register and one or more DACs in accordance with some implementations of the present disclosure.

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to crossbar array circuits with one or more slew rate controllers to reduce disturbance issues during in-memory computing operations are disclosed. The technologies described in the present disclosure may provide the following technical advantages.

First, the disclosed technologies use a slew rate controller to reduce disturbances between unselected devices and selected devices during in-memory computing operations.

Second, using a slew rate controller to control a selected row, a selected column, or a selected gate for the transistor may also prevent interference between devices during in-memory computing operations.

Finally, disturbances become more noticeable (or significant) during Vector-by-Matrix-Multiplication (VMM) operations, because the accumulation of parasitic capacitance of wires and devices is more significant in a large-scale crossbar array circuit. Therefore, using a slew rate controller in a crossbar array circuit as provided in the present disclosure increases the flexibility and scalability of large-scale crossbar array circuits.

Figure 1:
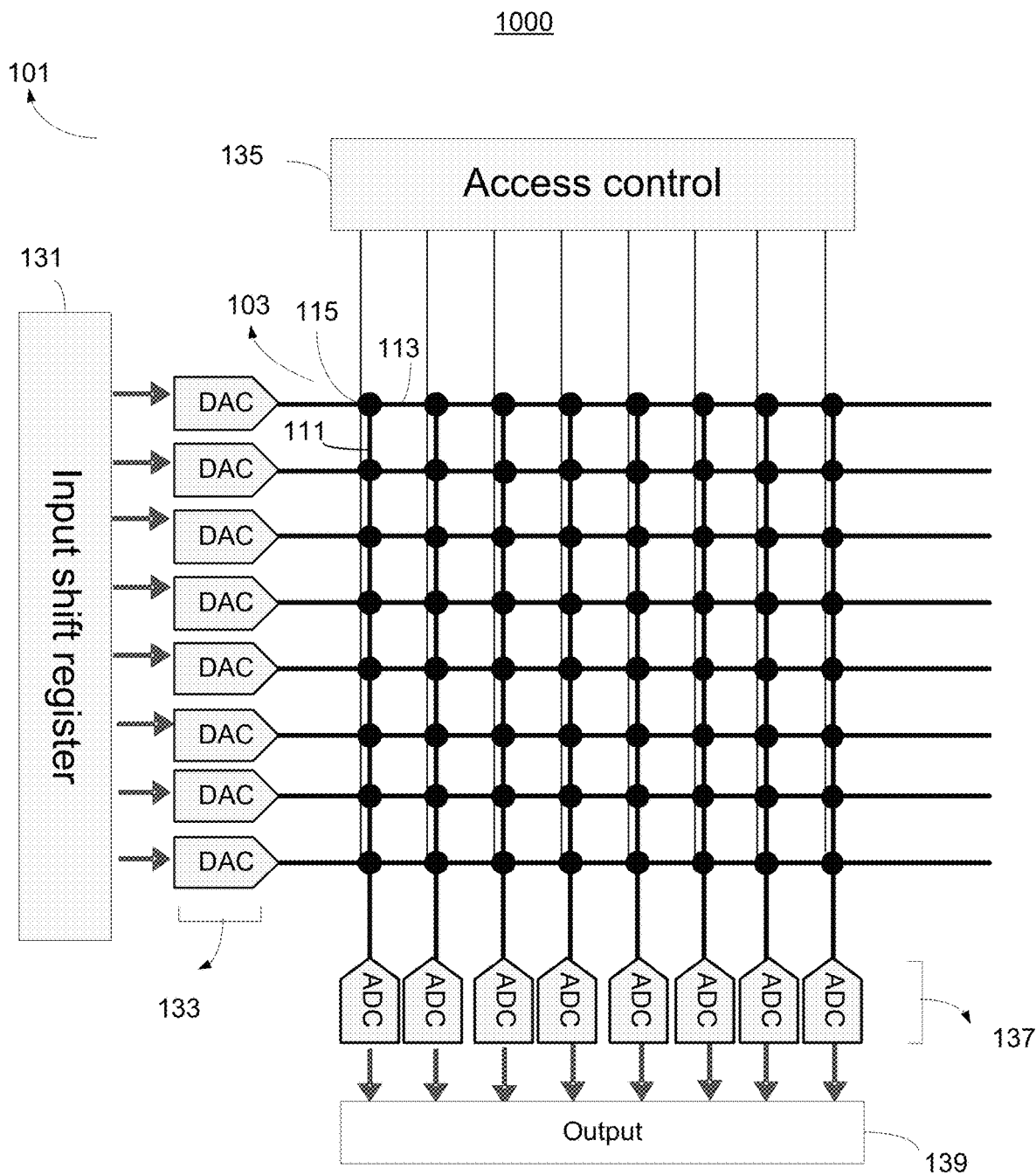
FIG. 1 is a block diagram illustrating an example crossbar array circuit.

FIG. 1 is a block diagram 1000 illustrating an example crossbar array circuit 101.

As shown in FIG. 1, the crossbar array circuit 101 includes a crossbar array 103 with one or more of bit lines (e.g., a bit line 111), one or more word lines (e.g., a word line 113), and one or more 1T1R cells (e.g., a 1T1R cell 115) connected between bit lines and word lines. The crossbar array circuit 101 may further include an input shift register 131, which is configured to deliver input signals; one or more DACs (e.g., a DAC 133) connected between the input shift register 131 and the word lines 113, where the DACs 133 is configured to receive input signals from the input shift register 131; one or more access controls (e.g., an access control 135) connected to the 1T1R cells 115, where the access controls 135 are configured to select a selected 1T1R cell to be programmed; one or more ADCs (e.g., an ADC 137) connected to the bit lines 111; and an output register 139) connected to the ADCs 137.

As explained above, because disturbances are more significant during Vector-by-Matrix-Multiplication (VMM) operations, the crossbar array circuit 101 may produce a greater number of computational errors.

Figure 2:
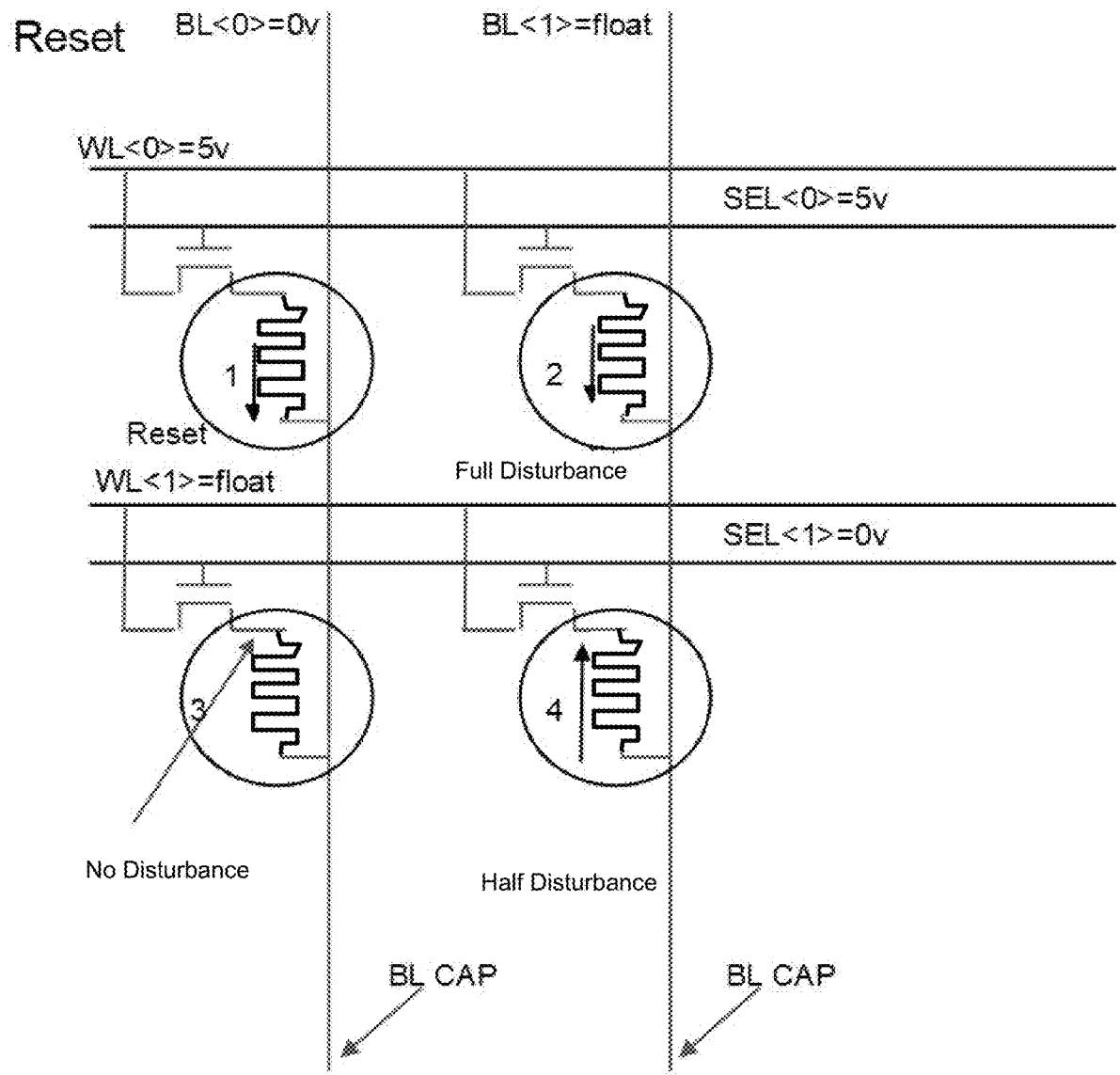
FIG. 2 is a schematic diagram illustrating an example occurrence of a disturbance during a RESET process of a first example crossbar circuit.

FIG. 2 is a schematic diagram 2000 illustrating an example occurrence of a disturbance during a RESET process in a one-transistor-one-RRAM (1T1R) crossbar circuit.

As shown in FIG. 2, during a RESET process of the RRAM cell 1, a 5V voltage is applied to the word line WL<0>; a 0V voltage is applied to the bit line BL<0>; and a 5V voltage is applied to the access control SEL<0>, to program the selected transistor and the RRAM cell 1. At the same time, the word line WL<1> and the bit line BL<1> are floated, and a 0V voltage is applied to the access control SEL<1> to disable unselected transistors and RRAM cells.

However, disturbance may occur during a RESET process if the voltage across an unselected RRAM cell exceeds a predefined amount of voltage the accumulated time duration. Even though the BL<1> is floated, it will be charged eventually by WL<0>5V, because the RRAM cell 2 shares the same word line with the RRAM cell 1. If the bit line junction capacity or other parasitic capacity is large enough, the unselected RRAM cell 2 may be un-intendedly programmed and thus disturbed by the voltage buildup across it. The unintended programming of an unselected cell may be referred to as disturbance.

The RRAM cell 3 endures no disturbance because the bit line BL<0> is 0V and the word line WL<0> is floated. The RRAM cell 4 endures half disturbance, because, even though the bit line BL<1> is floated, disturbance in the RRAM cell 2 charges the BL<1>'s capacity and raises the voltage across the BL<1> and the WL<1>.

Figure 3:
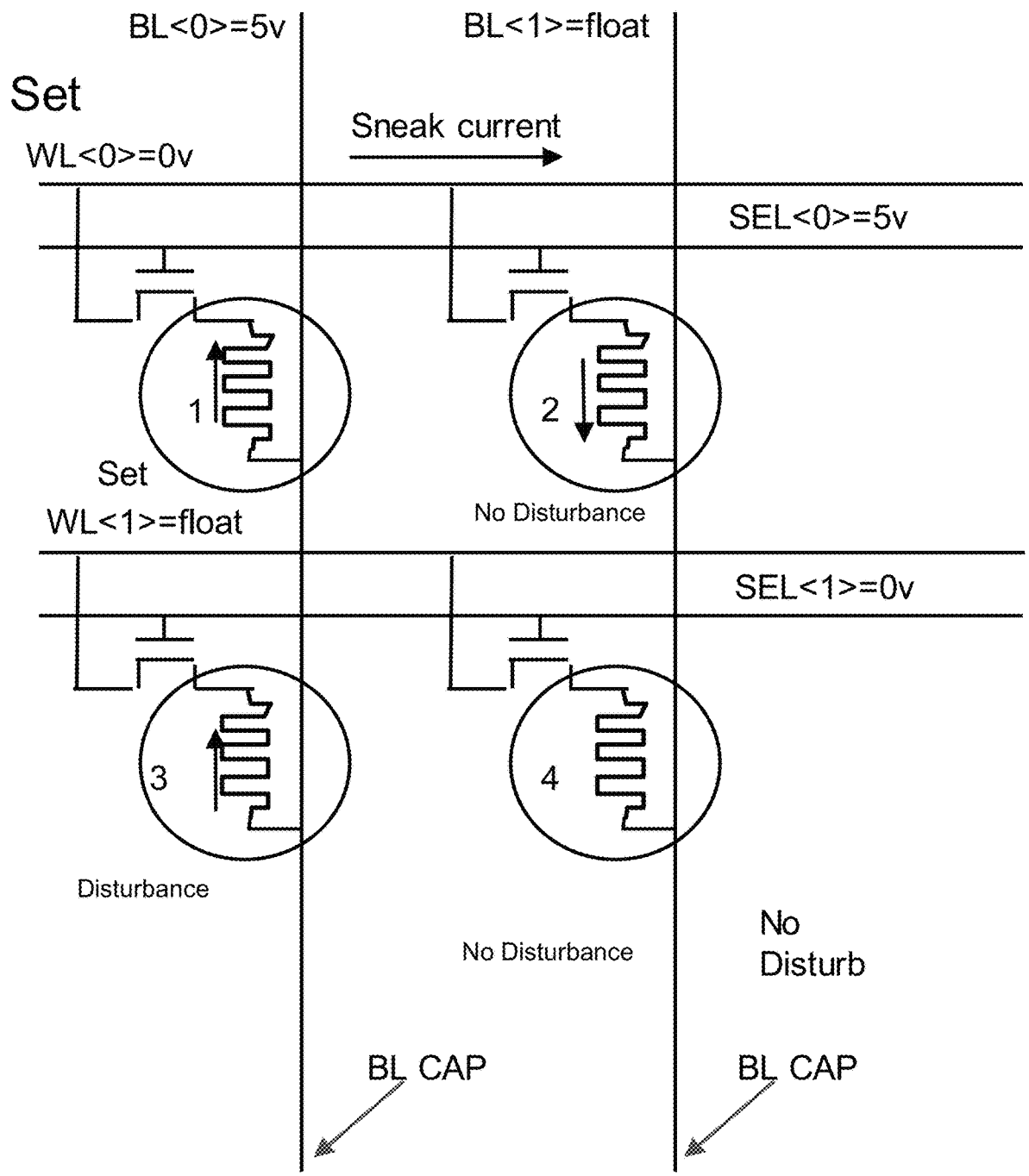
FIG. 3 is a schematic diagram illustrating an example occurrence of a disturbance occurred during a SET process of the first example crossbar circuit.

FIG. 3 is a schematic diagram illustrating an example occurrence of a disturbance occurred during a SET process of the first example crossbar circuit.

As shown in FIG. 3, during a SET process of the RRAM cell 1, the word line WL<0> is provided with a 0V voltage, the bit line BL<0> is provided with a 5V voltage, and the access control SEL<0> is provided with a 5V voltage to program the selected transistor and the RRAM cell 1. At the same time, the word line WL<1> and the bit line BL<1> are floated, and the access control SEL<1> is provided with 0V voltage to disable the unselected transistors and RRAM cells.

Disturbance may also occur during a SET operation if the voltage across an unselected RRAM cell exceeds a predefined amount within the accumulated time duration. Even though the WL<1> is floated, it may be charged eventually by BL<0>5V, because the RRAM cell 3 shares the same bit line with the RRAM cell 1. If the bit line junction capacity or other parasitic capacity is large enough, the unselected RRAM cell 3 may be un-intendedly programmed and thus disturbed by the voltage build-up across it.

Figure 4:
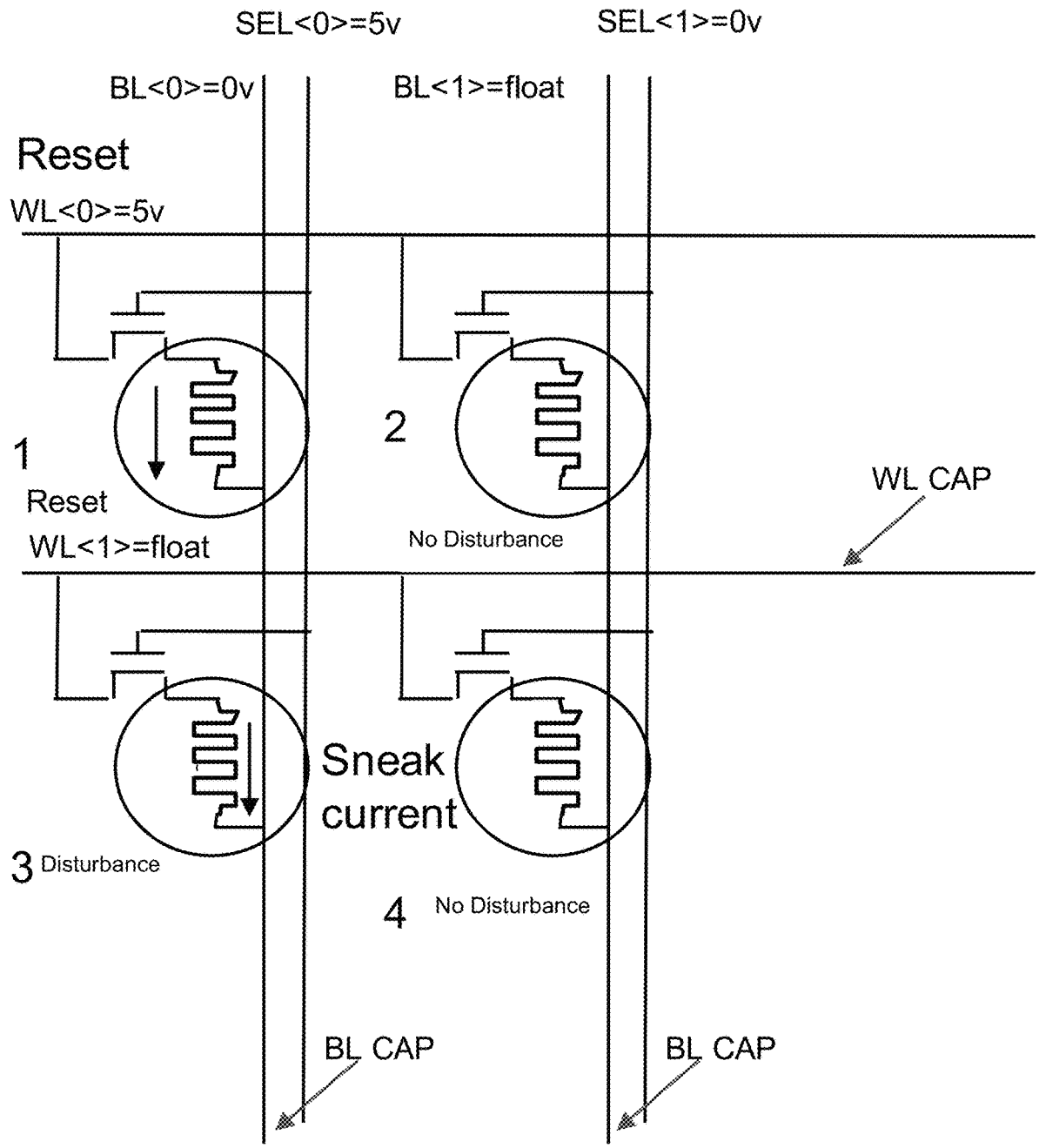
FIG. 4 is a schematic diagram illustrating an example occurrence of a disturbance occurred during a RESET process of a second example crossbar circuit.

FIG. 4 is a schematic diagram 4000 illustrating an example occurrence of a disturbance occurred during a RESET process of a second example crossbar circuit, which has a different architecture from those of the circuits shown in FIGS. 2-3.

As shown in FIG. 4, during a RESET process of the RRAM cell 1, a word line WL<0> is provided with a 5V voltage, a bit line BL<0> is provided with a 0V voltage, and an access control SEL<0> is provided with a 5V voltage to program the selected transistor and the RRAM cell 1. At the same time, the word line WL<1> is floated and the bit line BL<1> are floated, and the access control SEL<1> is given 0V voltage to disable unselected transistors and RRAM cells.

Disturbance may occur during a RESET process if the voltage across an unselected RRAM cell exceeds a predefined amount within the accumulated time duration. Even though the WL<1> is floated, it may be charged eventually by BL<0>, because the RRAM cell 3 shares the same bit line with the RRAM cell 1. If the bit line junction capacity or other parasitic capacity is large enough, the RRAM cell 3 may be un-intendedly programmed and thus disturbed by the voltage buildup across it.

Figure 5:
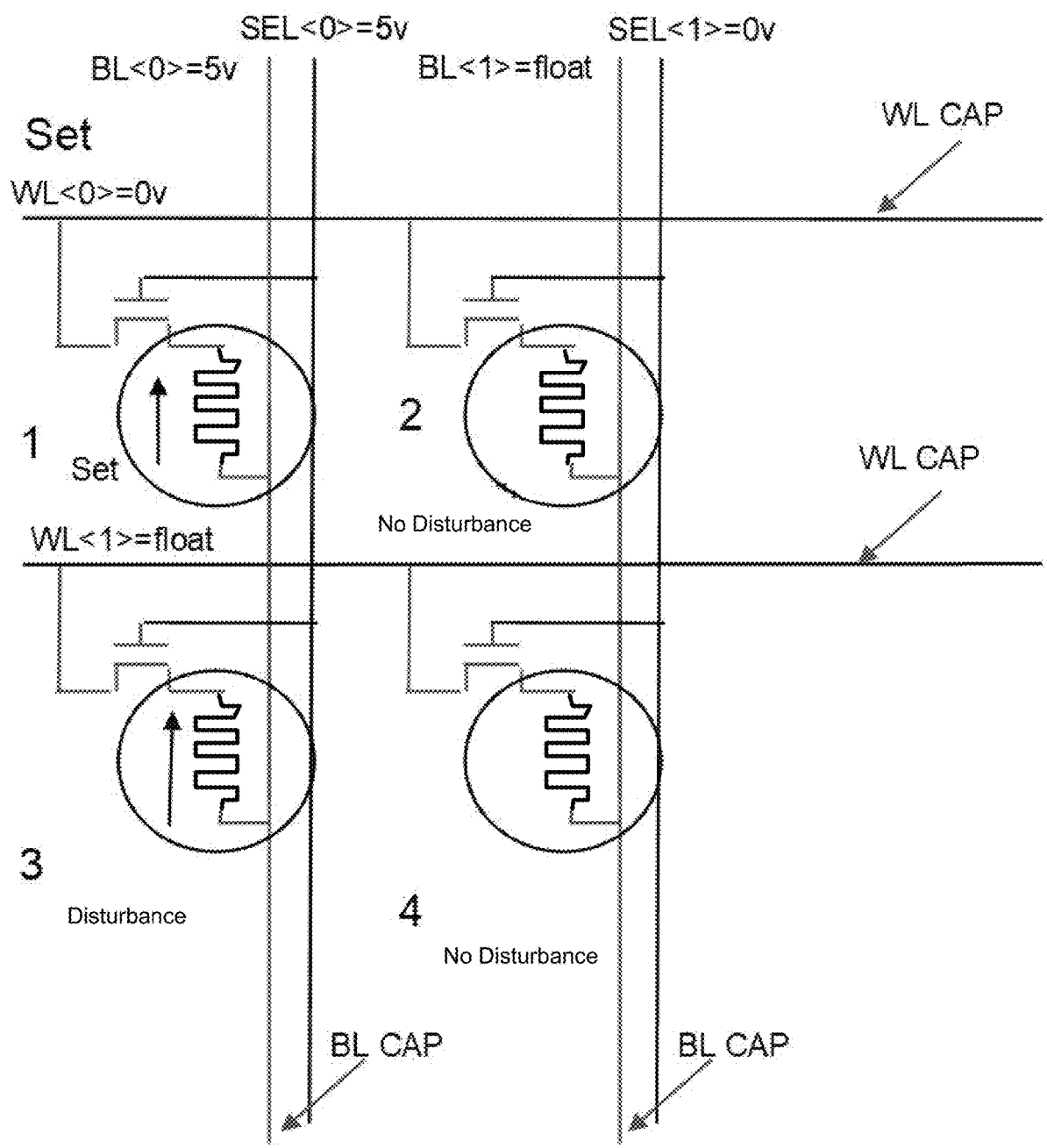
FIG. 5 is a schematic diagram illustrating an example occurrence of a disturbance occurred during a SET process of the second example crossbar circuit.

FIG. 5 is a schematic diagram 5000 illustrating an example occurrence of a disturbance occurred during a SET process of the second example crossbar circuit.

As shown in FIG. 5, during a SET process of the RRAM cell 1, the word line WL<0> is provided with a 0V voltage, the bit line BL<0> is provided with a 5V voltage, and the access control SEL<0> is provided with a 5V voltage to program the selected transistor and the RRAM cell 1. At the same time, the word line WL<1> is floated and the bit line BL<1> are floated, and the access control SEL<1> is given 0V to disable unselected transistors and RRAM cells.

Disturbance may occur during the SET operation if the voltage across an unselected RRAM cell exceeds a predefined amount the accumulated time duration. Even though the WL<1> is floated, it may be charged by BL<0>, because the RRAM cell 3 shares the same bit line with the RRAM cell 1. If the bit line junction capacity or other parasitic capacity is large enough, the RRAM cell 3 may be un-intendedly programmed and thus disturbed by the voltage buildup across it.

Because the disturbance issue relates to the Resistor-Capacity (RC) delay of the junction capacity or other parasitic capacities in the bit line, the word line, or the gate line (access control), it may be reduced by the impact of the RC delay.

FIG. 6A is a block diagram 6000 illustrating voltage across an RRAM device in relation to a step-functioned input.

As shown in FIG. 6A, when the voltage across an RRAM device is a step function of an input signal, a disturbance voltage may be read from the output at the peak of the rising voltage. This high voltage disturbance may unintendedly program an unselected RRAM device and could cause computing errors.

FIG. 6B is a block diagram 6100 illustrating the voltage across an RRAM device in relation to a slew rate-controlled input.

As shown in FIG. 6B, when the voltage across the RRAM device is a slew rate-controlled signal, a disturbance voltage may be read at the output. However, the peak of the rising voltage is relatively small, and the reduced disturbance voltage exponentially decays after reaching the peak. Because the disturbance voltage is significantly reduced, an unselected RRAM device may not be programmed during a computation process. Therefore, introducing a slew rate control in bias to the selected row, (and/or) selected column, (and/or) selected gate of transistors can reduce voltages across unselected RRAM devices and thus reduce disturbance during the computing operation. Such an advantage is also more significant in a large-scale crossbar array circuit.

FIG. 7 is a block diagram 7000 illustrating a crossbar array circuit 701 with a slew rate controller connected between an input register and one or more DACs in accordance with some implementations of the present disclosure.

As shown in FIG. 7, the crossbar array circuit 701 includes, one or more bit lines 713; one or more word lines 711; one or more 1T1R cells 715 connected between the bit lines 713 and the word lines 711; one or more ADCs 731 connected to the bit lines 713 and the output 739; one or more DACs 733 connected to the word lines 711; one or more access controls 735 connected to the 1T1R cells 715 and configured to select a 1T1R cell (e.g., a 1T1R cell 715) and program the selected 1T1R cell; and a first slew rate controller 7411 connected to the DACs 733. The first slew rate controller 7411 is configured to receive input signals from the input register 737.

Figure 8:
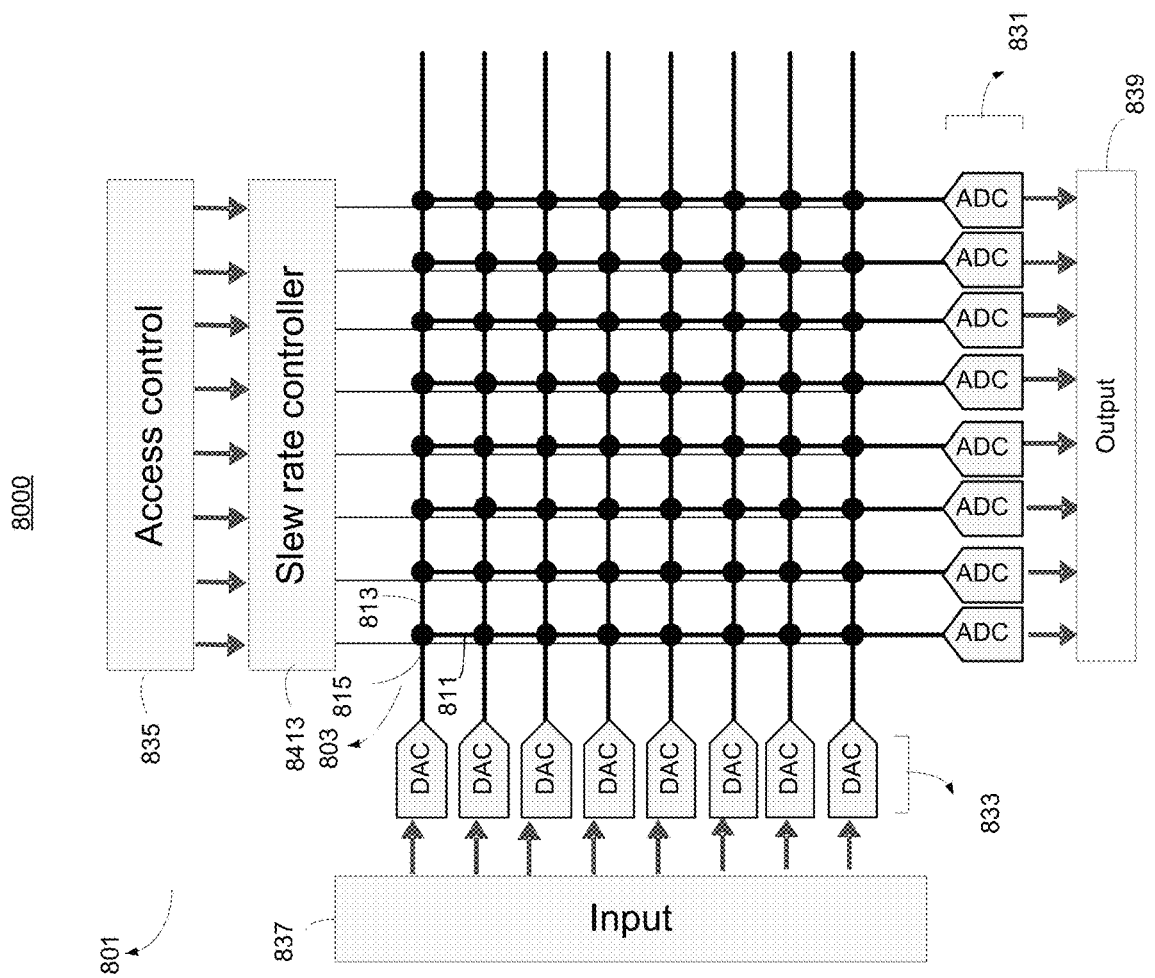
FIG. 8 is a block diagram illustrating a crossbar array circuit with a slew rate controller connected between an access control and one or more 1T1R cells in accordance with some implementations of the present disclosure.

FIG. 8 is a block diagram 8000 illustrating a crossbar array circuit 801 with a slew rate controller connected between an access control and one or more 1T1R cells in accordance with some implementations of the present disclosure.

As shown in FIG. 8, the crossbar array circuit 801 includes, one or more bit lines 813; one or more word lines 811; one or more 1T1R cells 815 connected between the bit lines 813 and the word lines 811; one or more ADCs 831 connected to output 839 and the bit lines 813; one or more DACs 833 connected to input 837 and the word lines 811; and one or more access controls 835 connected to the 1T1R cells 815, via a slew rate controller 8413 and configured to select a 1T1R cell (e.g. a 1T1R cell 815) in the one or more 1T1R cells and program the selected 1T1R cell. The slew rate controller 8413 is configured to receive a selected access control signal from the access control 835.

Figure 9:
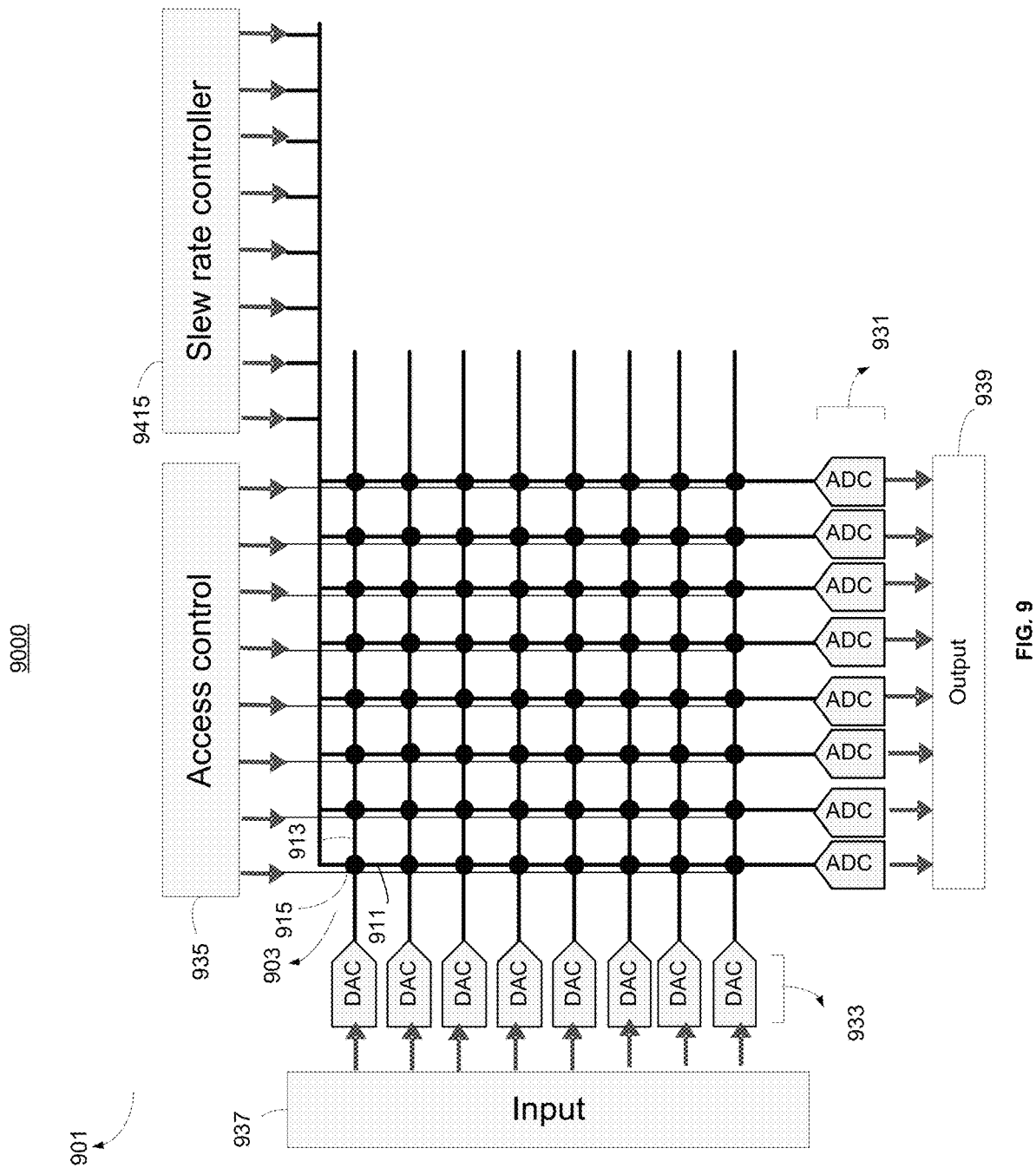
FIG. 9 is a block diagram illustrating a crossbar array circuit with a slew rate controller connected to a bit line in accordance with some implementations of the present disclosure.

FIG. 9 is a block diagram 9000 illustrating a crossbar array circuit 901 with a slew rate controller connected to a bit line in accordance with some implementations of the present disclosure.

As shown in FIG. 9, a crossbar array circuit 901 includes, one or more bit lines 913; one or more word lines 911; one or more 1T1R cells 915 connected between the bit lines 913 and the word lines 911; one or more ADCs 931 connected to the output 939 and the bit lines 913; one or more DACs 933 connected to the input 937 and the word lines 911; one or more access controls 935 connected to the 1T1R cells 915 and configured to select a selected 1T1R cell (e.g. a 1T1R cell 915) to be programmed; and a slew rate controller 9415 connected to the bit lines 913. The slew rate controller 9415 is configured to receive an input signal or a bias.

In some implementations, each of the 1T1R cells 715-915 includes an access transistor and an RRAM device (e.g., a 1T1R configuration).

In some implementations, the slew rate controller 7411 (shown in FIG. 7), the slew rate controller 8413 (shown in FIG. 8) and the slew rate controller 9415 (shown in FIG. 9) are configured to transform a step function input signal into a slew rate input signal.

In some implementations, the slew rate controller 7411, the slew rate controller 8413 and the slew rate controller 9415 may be used in the same crossbar array circuit.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A crossbar array circuit comprising:
   one or more bit lines;
   one or more word lines;
   one or more cell devices connected between the bit lines and the word lines, wherein each of the cell devices comprises a Resistive Random-Access Memory (RRAM) device;
   one or more ADCs connected to the one or more bit lines;
   one or more DACs connected to the one or more word lines;
   one or more access controls connected to the one or more cell devices and configured to select a cell device in the one or more cell devices and to program the selected cell device; and
   a slew rate controller connected between the one or more DACs and an input register, wherein the slew rate controller is configured to receive an input signal from the input register and output a slew-rate controlled signal to the DACs, and wherein the one or more DACs provide a voltage corresponding to the slew-rate controlled signal to a word line of the one or more word lines that is connected to the selected cell device.

2. The crossbar array circuit as claimed in claim 1, wherein a cell device in the one or more cell devices is a 1T1R cell.

3. The crossbar array circuit as claimed in claim 2, wherein the 1T1R cell in the one or more cell devices comprises a transistor.

4. The crossbar array circuit as claimed in claim 2, wherein the slew rate controller is configured to transform a step function input signal into a slew rate input signal.

5. The crossbar array circuit as claimed in claim 2, wherein a cell device in the one or more cell devices is a 2T1R cell comprising two transistors.

6. The crossbar array circuit as claimed in claim 1, wherein a cell device in the one or more cell devices is an nTmR cell comprising n transistors, wherein n represents an integer, and wherein m represents a same or a different integer.

7. A crossbar array circuit comprising:
   one or more bit lines;
   one or more word lines;
   one or more cell devices connected between the bit lines and the word lines, wherein each of the cell devices comprises a Resistive Random-Access Memory (RRAM) device;
   one or more ADCs connected to the one or more bit lines;
   one or more DACs connected to the one or more word lines;
   one or more access control devices connected to the one or more cell devices and configured to select a cell device in the one or more cell devices and to program the selected cell device; and
   a slew rate controller connected to the one or more access controls and the one or more cell devices, wherein the slew rate controller is configured to receive a selected access control signal from one of the one or more access control devices and provide a slew-rate controlled signal to the selected cell device to program the selected cell device.

8. The crossbar array circuit as claimed in claim 7, wherein a cell device in the one or more cell devices is a 1T1R cell.

9. The crossbar array circuit as claimed in claim 8, wherein the 1T1R cell in the one or more cell devices comprises a transistor.

10. The crossbar array circuit as claimed in claim 8, wherein the slew rate controller is configured to transform a step function signal into a slew rate input signal.

11. The crossbar array circuit as claimed in claim 7, wherein a cell device in the one or more cell devices is a 2T1R cell comprising two transistors.

12. The crossbar array circuit as claimed in claim 7, wherein a cell device in the one or more cell devices is an nTmR cell comprising n transistors, wherein n represents an integer, and wherein m represents a same or a different integer.

* * * * *